US010292299B2

(12) United States Patent
Adrian

(10) Patent No.: US 10,292,299 B2
(45) Date of Patent: May 14, 2019

(54) CABLE MANAGEMENT SYSTEM

(71) Applicant: Facebook, Inc., Menlo Park, CA (US)

(72) Inventor: Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/280,741

(22) Filed: Sep. 29, 2016

(65) Prior Publication Data

US 2018/0092238 A1 Mar. 29, 2018

(51) Int. Cl.
*H05K 7/14* (2006.01)

(52) U.S. Cl.
CPC .................. *H05K 7/1491* (2013.01)

(58) Field of Classification Search
CPC .. H05K 7/1491; H05K 7/1489; H05K 7/1492; H05K 7/183
See application file for complete search history.

(56) References Cited

U.S. PATENT DOCUMENTS

| | | | | |
|---|---|---|---|---|
| 6,327,139 B1* | 12/2001 | Champion | ............. | H02B 1/202 174/69 |
| 6,407,933 B1* | 6/2002 | Bolognia | ............. | H05K 7/1491 174/168 |
| 6,646,893 B1* | 11/2003 | Hardt | ................... | H05K 7/1491 361/730 |
| 7,009,112 B1* | 3/2006 | Mead | ................... | H05K 7/1491 174/69 |
| 9,781,859 B1* | 10/2017 | Wishman | ............. | H05K 7/1491 |
| 9,996,119 B2* | 6/2018 | Leigh | ......................... | G06F 1/18 |
| 2006/0162948 A1* | 7/2006 | Rinderer | ................ | H05K 7/186 174/50 |
| 2008/0002362 A1* | 1/2008 | Ishimine | ............. | H05K 7/1489 361/695 |
| 2012/0134086 A1* | 5/2012 | Zhang | ..................... | G06F 1/181 361/679.02 |
| 2012/0292267 A1* | 11/2012 | Goldenberg | ........ | H05K 7/1491 211/26 |
| 2012/0293932 A1* | 11/2012 | Jai | ........................ | H05K 7/1491 361/679.02 |
| 2016/0330859 A1* | 11/2016 | Chen | .................... | H05K 7/1491 |
| 2016/0360637 A1* | 12/2016 | Harvilchuck | ........ | H05K 7/1491 |
| 2017/0164506 A1* | 6/2017 | Anderson | ............. | G06F 1/1613 |
| 2017/0262028 A1* | 9/2017 | Rubenstein | ............ | G06F 1/181 |
| 2017/0332508 A1* | 11/2017 | Niazmand | ........... | H05K 7/1491 |
| 2017/0332509 A1* | 11/2017 | Miyatsu | ............... | H05K 7/1491 |

* cited by examiner

*Primary Examiner* — Hoa C Nguyen
*Assistant Examiner* — Christopher L Augustin
(74) *Attorney, Agent, or Firm* — FisherBroyles, LLP

(57) ABSTRACT

A cable management system including a component rack including a top wall, a bottom wall, and first and second spaced apart sidewalls extending therebetween to define a rack interior. A pair of drawer slides are attached to the first and second sidewalls in the rack interior and a chassis is attached to the pair of drawer slides whereby the chassis is movable between a stowed position inside the rack interior and a service position outside the rack interior. At least one cable retainer is attached to the chassis between the chassis and the first sidewall. A cable is positioned between the chassis and the rack and the cable includes a first portion extending from the chassis, a second portion fastened to the at least one cable retainer between the drawer chassis and the first sidewall in a looped configuration, and a third portion attached to the first sidewall.

13 Claims, 4 Drawing Sheets

CABLE MANAGEMENT SYSTEM

TECHNICAL FIELD

This patent application generally relates to data storage server configurations, and more specifically, to cable management.

BACKGROUND

Many servers and other computer systems contain components housed in a component rack in sliding drawers, which allows a user to easily access and replace the components. Conventionally, flexible cables are connected to the rear of the sliding drawer to provide power and/or communication to components in the drawer. The flexibility of the cables allows the cable to remain connected when the drawer is slid out of the rack. However, the cables must be as long as the desired travel length of the tray. Thus, if access to the entire length of the sliding drawer is desired, the cables must be at least as long as the length of the drawer. This causes the cables to occupy a considerable amount of space when the drawer is fully inside the rack, and the occupied space impedes airflow within the rack, limiting cooling of the components within the rack.

BRIEF DESCRIPTION OF THE DRAWINGS

The cable management system introduced here may be better understood by referring to the following Detailed Description in conjunction with the accompanying drawings in which like reference numerals indicate identical or functionally similar elements.

Figure 1:
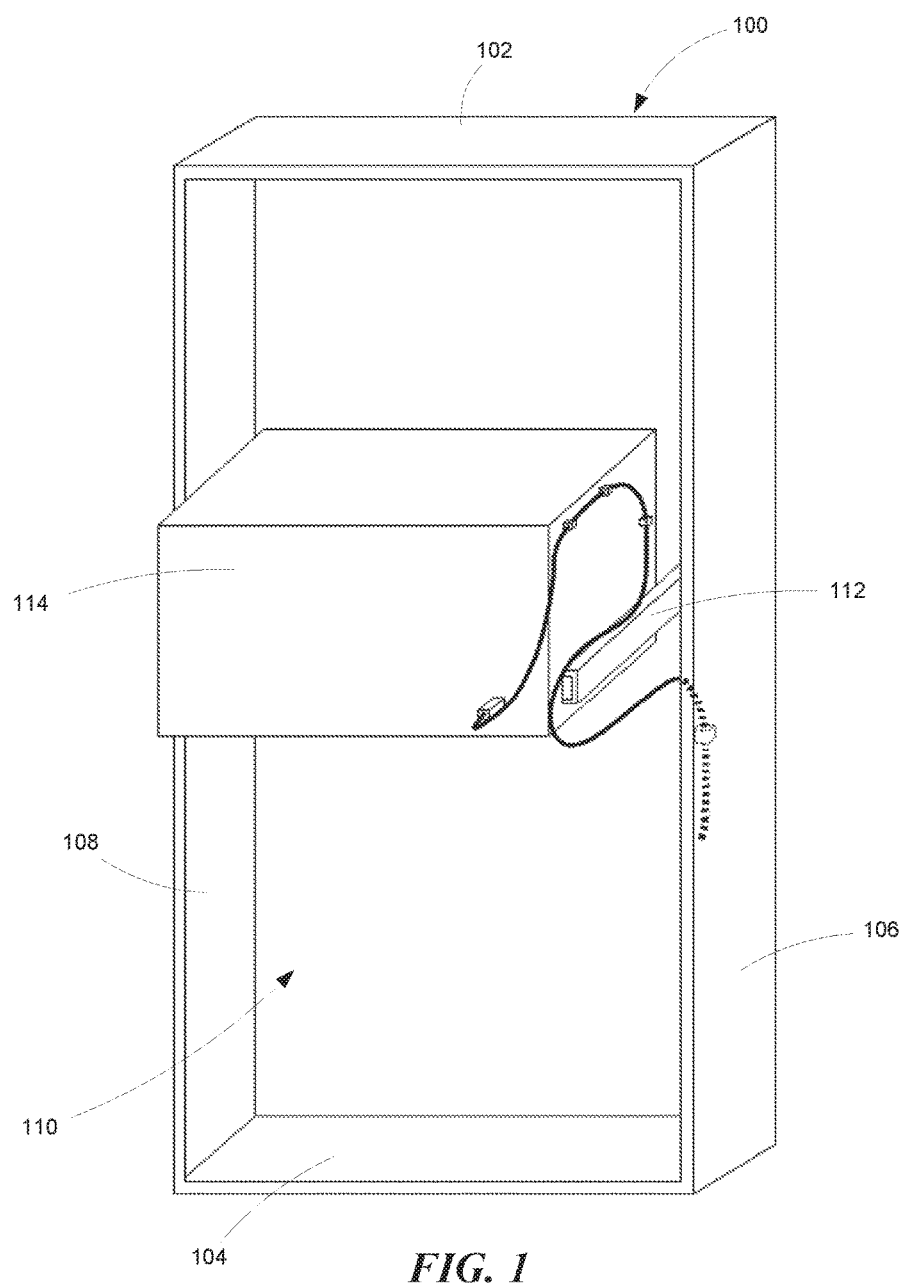
FIG. 1 is an isometric view of a component rack including a cable management system according to a representative embodiment.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A cable management system is disclosed. In a representative embodiment, the cable management system includes a component rack including a top wall, a bottom wall, and first and second spaced apart sidewalls extending therebetween to define a rack interior. A pair of drawer slides are attached to the first and second sidewalls in the rack interior and a chassis is attached to the pair of drawer slides, whereby the chassis is movable between a stowed position inside the rack interior and a service position at least partially outside the rack interior. At least one cable retainer is attached to the chassis between the chassis and the first sidewall. A cable is positioned between the chassis and the rack. In an embodiment, the cable includes a first portion extending from the chassis, a second portion fastened to the cable retainer between the drawer chassis and the first sidewall in a looped configuration, and a third portion attached to the first sidewall. The second portion provides a service loop that allows the chassis to be moved between the stowed position and the service position without disconnecting the cable.

General Description

Various examples of the devices introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates a component rack 100 including a cable management system according to a representative embodiment. The component rack 100 includes a top wall 102, a bottom wall 104, and first and second spaced apart sidewalls 106 and 108 surrounding a rack interior 110. A pair of drawer slides 112 are attached to the first and second sidewalls 106 and 108 in the rack interior 110. A chassis 114 is attached to the pair of drawer slides 112, whereby the chassis 114 is movable between a closed or stowed position inside the rack interior 110 and an opened or service position at least partially outside the rack interior 110. In some embodiments, the chassis 114 can comprise a drawer containing one or more electronic components or devices. In other embodiments, the chassis 114 comprises the frame of an electronic component or device.

Figure 2:
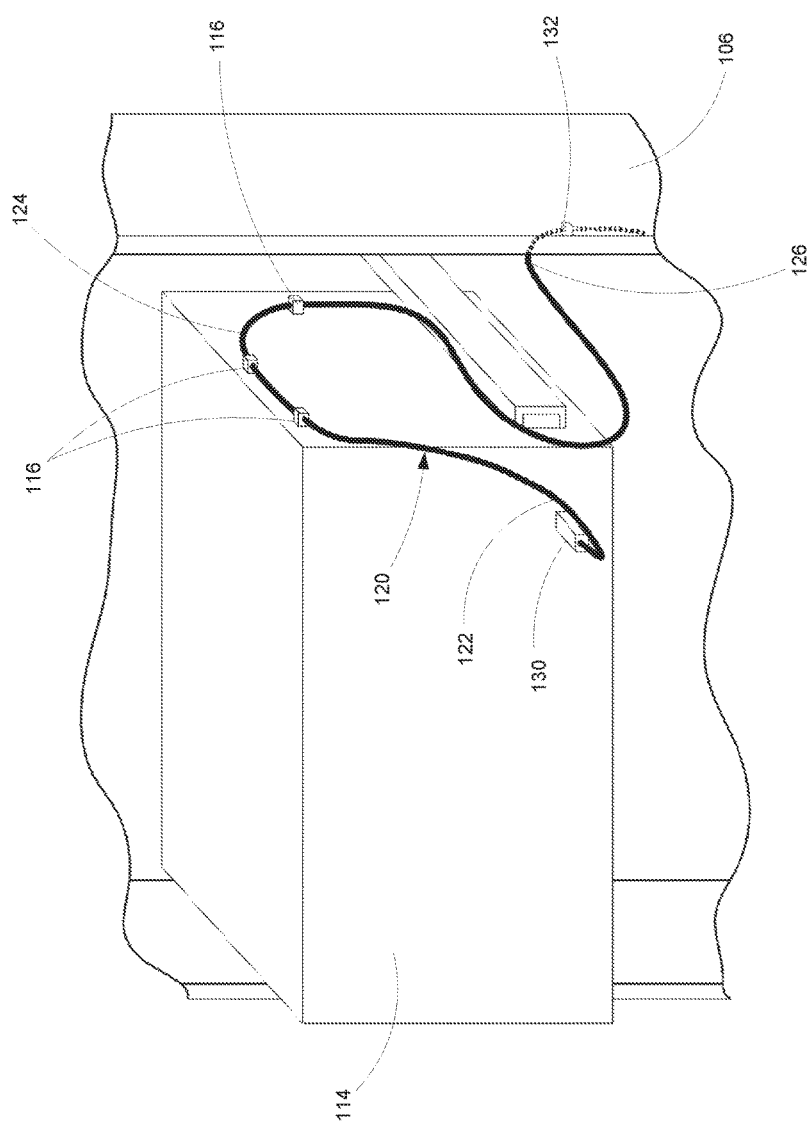
FIG. 2 is an enlarged partial isometric view of the cable management system shown in FIG. 1 with the drawer in a service position.

As shown in FIG. 2, a cable 120 extends from the chassis 114 to the first sidewall 106 and may further extend to connect to another component or a power source, for example. The cable 120 includes a connector 130 connectable to the chassis 114. In one embodiment, one end portion of the cable 120 may extend through a wall and the chassis 114 and the connector 130 may be connectable to a component within the chassis 114. In various embodiments, the cable 120 can comprise a communication cable or a power cable, for example. A plurality of cable retainers 116 are attached to the chassis 114 between the chassis 114 and the first sidewall 106. The cable 120 includes a first portion 122 extending from the chassis 114, a second portion 124 fastened to the cable retainers 116 between the chassis 114 and the first sidewall 106 in a looped configuration, and a third portion 126 attached to the first sidewall 106. The third portion 126 can be attached to the first sidewall 106 with a cable retainer 132. The cable retainers 116 and 132 can be any suitable retainer or fastener including, for example and without limitation, clips, clamps, hooks, straps, and the like. The cable retainers 113 and 132 can be configured to releasably retain the second portion 124 of the cable 120 along the side of the chassis 114, while allowing the second portion 124 to be manually removed, such as in connection with maintenance or replacement of a component within the chassis.

Figure 3:
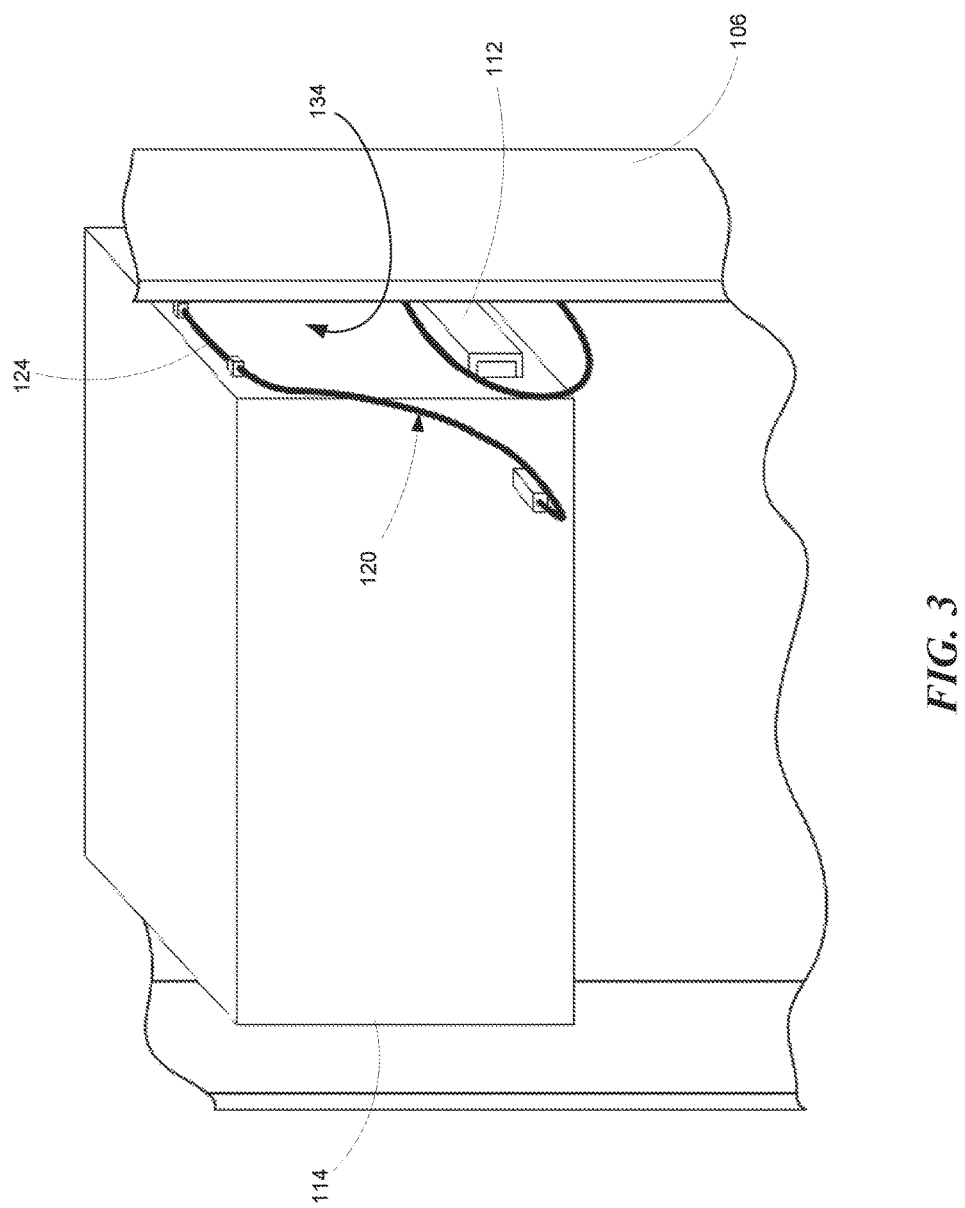
FIG. 3 is an enlarged partial isometric view of the cable management system shown in FIG. 1 with the drawer in a stowed position.

The cable 120 has a length that allows for movement of the chassis 114 between the service position and stowed position. With further reference to FIG. 3, the second portion 124 of the cable 120 provides a service loop to facilitate movement of the chassis 114 between the service position (FIG. 2) and the stowed position (FIG. 3) so the cable 120 does not interfere with the movement. When the chassis 114 is in the stowed position, the cable 120 is positioned in a space 134 between the chassis 114 and the first sidewall 106 corresponding to a width of the drawer slide 112. The cable 120 moves into and out of the space 134 with the chassis 114 as it moves from the service position to the stowed position. The cable 120 enters the space 134 toward the top of the chassis 114, loops approximately 180 degrees, and exits the space 134 toward the bottom of the chassis 114. Although, the illustrated embodiments show the cable 120 entering space 134 toward the top of the chassis 114 and exiting toward the bottom of the chassis 114, in other embodiments the cable 120 can enter the space 134 toward the bottom and exit toward the top of the chassis 114. In yet other embodiments, the cable 120 can enter and exit the space 134 at other intermediate locations between the top and bottom of the chassis 114.

Figure 4:
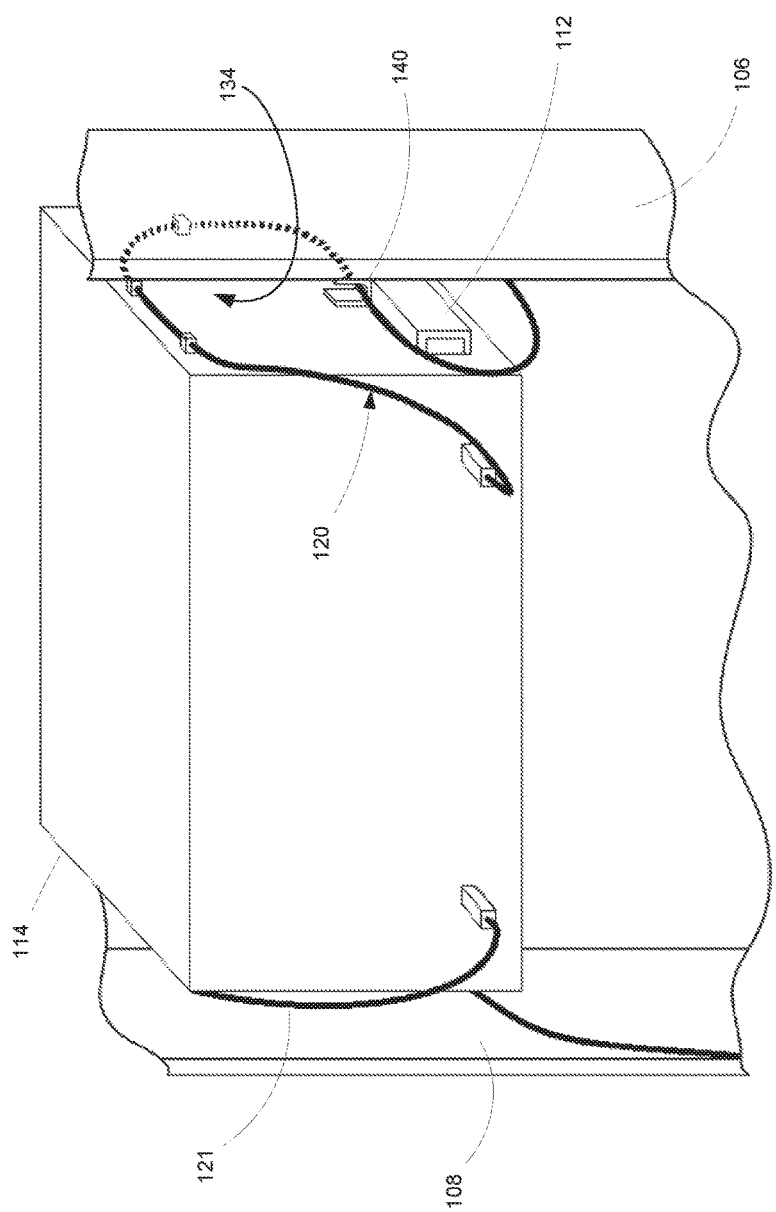
FIG. 4 is an enlarged partial isometric view of a cable management system according to another embodiment including a cable guide.

In some embodiments, a cable guide 140, as shown in FIG. 4, can be positioned between the chassis 114 and the rack sidewall 106 to facilitate movement of the cable 120 into and out of the space 134. In the illustrated embodiment, the cable guide 140 comprises a U-shaped channel suitably fastened to the first sidewall 106. In other embodiments, the cable guide 140 can be attached to the chassis 114 or the drawer slide 112. Although the disclosed embodiments illustrate a single cable 120, multiple cables can be similarly managed by looping the cables in space 134 and securing them to the chassis 114. Furthermore, one or more cables 121 can be routed between the chassis 114 and the second sidewall 108 using the techniques described above.

Remarks

The above description, drawings, and appendices are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A cable management system for use in a rack, the system comprising:
    a pair of drawer slides attachable to the rack;
    a chassis attached to the pair of drawer slides and thereby movable between a closed position and an open position with respect to the rack, wherein the chassis comprises a sidewall, the sidewall includes a top end, a bottom end, a proximal end, and a distal end opposite the proximal end, and one of the pair of drawer slides is directly attached to the sidewall at the bottom end of the sidewall;
    a first cable retainer directly attached to the sidewall of the chassis at the top end of the sidewall and at the proximal end of the sidewall and between the chassis and the rack;
    a second cable retainer directly attached to the sidewall of the chassis at the distal end of the sidewall and between the top end of the sidewall and the one of the pair of drawer slides; and
    a third cable retainer attached to the rack below the one of the pair of drawer slides, whereby one or more cables can be positioned in a first loop between the chassis and the rack and between the top end of the sidewall and the one of the pair of drawer slides, and a second loop around the one of the pair of drawer slides.

2. The cable management system of claim 1, further comprising a cable guide positioned between the chassis and the rack to facilitate movement of the one or more cables therebetween.

3. The cable management system of claim 1, further comprising a plurality of cable retainers attached to the sidewall.

4. The cable management system of claim 3, wherein the one or more cables are looped 180 degrees between the sidewall and the rack.

5. A cable management system, comprising:
    a component rack including a top wall, a bottom wall, and first and second spaced apart sidewalls extending therebetween to define a rack interior;
    a pair of drawer slides attached to the first and second sidewalls in the rack interior;

a chassis attached to the pair of drawer slides whereby the chassis is movable between a stowed position inside the rack interior and a service position outside the rack interior, wherein the chassis comprises a sidewall, the sidewall includes a top end, a bottom end, a proximal end, and a distal end opposite the proximal end, and one of the pair of drawer slides is directly attached to the sidewall at the bottom end of the sidewall of the chassis;

a first cable retainer directly attached to the sidewall of the chassis at the top end of the sidewall and at the proximal end of the sidewall of the chassis and between the chassis and the first sidewall of the rack;

a second cable retainer directly attached to the sidewall of the chassis at the distal end of the sidewall and between the top end of the sidewall and the one of the pair of drawer slides;

a third cable retainer attached to the first sidewall of the rack below the one of the pair of drawer slides; and a cable including a first portion extending from the chassis, a second portion fastened to the first cable retainer and the second cable retainer between the drawer chassis and the first sidewall in a first looped configuration, and a third portion attached to the first sidewall with the third cable retainer in a second looped configuration around the one of the pair of drawer slides.

6. The cable management system of claim 5, further comprising a cable guide positioned between the chassis and the first sidewall to facilitate movement of the cable therebetween.

7. The cable management system of claim 6, wherein the cable guide is attached to the rack.

8. The cable management system of claim 5, wherein the second portion of the cable is looped 180 degrees between the chassis and the first sidewall.

9. The cable management system of claim 5, further comprising a second cable extending between the drawer chassis and the second sidewall in a looped configuration.

10. A method for managing a cable for a chassis attached to a rack with a pair of drawer slides and movable between a stowed position inside the rack and a service position outside the rack, the method comprising:

connecting the cable to the chassis at a wall of the chassis, wherein the wall is connected to a sidewall of the chassis, the sidewall includes a top end, a bottom end, a proximal end, and a distal end opposite the proximal end, and one of the pair of drawer slides is directly attached to the sidewall at the bottom end of the sidewall;

positioning a first portion of the cable in a looped configuration between the sidewall of the chassis and a sidewall of the rack;

attaching a first cable retainer directly to the sidewall of the chassis at the top end of the sidewall at at the proximal end of the sidewall and between the chassis and the sidewall of the rack;

fastening the first portion of the cable to the first cable retainer;

attaching a second cable retainer directly to the sidewall of the chassis at the distal end of the sidewall and between the top end of the sidewall and the one of the pair of drawer slides;

fastening a second portion of the cable to the second cable retainer in a first looped configuration between the chassis and the first sidewall of the rack and between the top end of the sidewall and the one of the pair of drawer slides;

attaching a third cable retainer to the rack below the one of the pair of drawer slides; and fastening the cable to the third cable retainer in a second looped configuration around the one of the pair of drawer slides.

11. The method of claim 10, further comprising attaching a third portion of the cable to the sidewall of the rack.

12. The method of claim 10, further comprising positioning a cable guide between the chassis and the sidewall of the rack to facilitate movement of the cable therebetween.

13. The method of claim 10, further comprising looping the cable 180 degrees between the chassis and the sidewall of the rack.

* * * * *

UNITED STATES PATENT AND TRADEMARK OFFICE
CERTIFICATE OF CORRECTION

PATENT NO. : 10,292,299 B2
APPLICATION NO. : 15/280741
DATED : May 14, 2019
INVENTOR(S) : Jason David Adrian Page 1 of 1

It is certified that error appears in the above-identified patent and that said Letters Patent is hereby corrected as shown below:

In the Claims

In Column 6, Line 14, Claim 10, after "at" delete "at".

Signed and Sealed this
Ninth Day of July, 2019

Andrei Iancu
*Director of the United States Patent and Trademark Office*